(12) United States Patent
Heuermann

(10) Patent No.: US 7,130,756 B2
(45) Date of Patent: Oct. 31, 2006

(54) CALIBRATION METHOD FOR CARRYING OUT MULTIPORT MEASUREMENTS ON SEMICONDUCTOR WAFERS

(75) Inventor: Holger Heuermann, Weyarn (DE)

(73) Assignee: SUSS MicroTec Test System GmbH, Sacka (DE)

( * ) Notice: Subject to any disclaimer, the term of this patent is extended or adjusted under 35 U.S.C. 154(b) by 0 days.

(21) Appl. No.: 10/810,417

(22) Filed: Mar. 26, 2004

(65) Prior Publication Data

US 2004/0246004 A1    Dec. 9, 2004

(30) Foreign Application Priority Data

Mar. 28, 2003   (DE)   ............... 103 14 463

(51) Int. Cl.
  *G01R 35/00* (2006.01)
(52) U.S. Cl. .............. 702/107; 702/85; 324/601
(58) Field of Classification Search .............. 702/56, 702/66, 72, 8, 5, 107, 188–189; 324/601, 324/73.1; 714/736
See application file for complete search history.

(56) References Cited

U.S. PATENT DOCUMENTS

| | | | | |
|---|---|---|---|---|
| 5,548,538 A | * | 8/1996 | Grace et al. ............ | 702/85 |
| 5,578,932 A | * | 11/1996 | Adamian ............... | 324/601 |
| 5,715,183 A | * | 2/1998 | Grace et al. ............ | 702/85 |
| 5,748,506 A | * | 5/1998 | Bockelman ............ | 702/85 |
| 6,060,888 A | * | 5/2000 | Blackham et al. ....... | 324/601 |
| 6,853,198 B1 | * | 2/2005 | Boudiaf et al. ......... | 324/601 |

FOREIGN PATENT DOCUMENTS

DE   19918697   * 11/1999
DE   19918960   * 11/1999

OTHER PUBLICATIONS

Ferrero et al., "A new implementation of a multiport automatic network analyzer", Nov. 1992, Microwave Theory and Techniques, IEEE Transactions on, vol. 40 issue 11, pp. 2078-2085.*
Rodriguez, "Comparison between the ripple technique and the direct calibration method for characterisation of directional devices", Jul. 2000, Science, Measurement and Technology, IEE Proceedings, vol. 147 issue 4, pp. 196-201.*
Ferrero et al., "A New Implementation of a Multiport Automatic Network Analyzer," IEEE Transactions on Microwave Theory And Techniques, Col. 40, No. 11, Nov. 1992.

* cited by examiner

Primary Examiner—Marc S. Hoff
Assistant Examiner—Mary Catherine Baran
(74) Attorney, Agent, or Firm—Baker Botts L.L.P.

(57) ABSTRACT

The invention relates to a method for calibrating a vectorial network analyzer having n measurement ports and at least 2n measurement locations (n>1) by successive measurement of the reflection and transmission parameters at different two-port calibration standards, which are connected between the measurement ports in any desired order and must all have a transmission path, and three different n-port calibration standards, which are connected between the measurement ports in any desired order and which are not permitted to show transmission and by calculation of error coefficient and scattering matrix [Sx] with the 10-term or 7-term multiport method. An object of the invention is to propagate a method for calibrating these vectorial network analyzer used for multiport measurement which permits a calibration with increased precision and considerable reproducibility of measurement.

7 Claims, 1 Drawing Sheet

CALIBRATION METHOD FOR CARRYING OUT MULTIPORT MEASUREMENTS ON SEMICONDUCTOR WAFERS

CROSS-REFERENCE TO RELATED APPLICATIONS

This invention claims priority from German Patent Application No. 103 14 463.3, filed Mar. 28, 2003.

FIELD OF THE INVENTION

The invention relates to a method for calibrating a vectorial network analyzer having n measurement ports and at least 2n measurement locations (n>1) by successive measurement of the reflection and transmission parameters at different two-port calibration standards, which are connected between the measurement ports in any desired order and must all have a transmission path, and three different n-port calibration standards, which are connected between the measurement ports in any desired order and which are not permitted to show transmission.

BACKGROUND OF THE INVENTION

Vectorial network analyzers (VNAs) serve for the precise measurement of electronic devices and components and also active and passive radiofrequency circuits and assemblies through to antennas.

The so-called scattering parameters of n-ports (n=1, 2, . . . ) are detected, which, if appropriate, are converted into 2n-pol-parameters (e.g., Z or Y parameters).

A so-called system error correction provides for the actual possibility of carrying out precise measurements using VNAs. In modem apparatuses, the measurement accuracy of VNAs is influenced almost exclusively by the possibility of realizing the calibration standards required for the system error correction.

As it is known, the reflection and/or transmission behavior of calibration standards, which are partly or completely known objects, is measured during the system error correction in the so-called calibration operation, at several measurement locations which are to optimize in position and amount.

From these measured values, correction data (so-called error variables or coefficients) are obtained by means of special computation methods. With this correction data and a corresponding correction calculation, measured values from which system errors of the VNA and of the leads (instances of coupling=crosstalk, mismatches=reflections) have been eliminated are obtained for any desired measurement object.

The customary form of description of the electrical behavior of components and circuits in radiofrequency technology is effected by means of the scattering parameters (also called S parameters). They link wave variables with one another, rather than currents and voltages. This representation is particularly adapted to the physical conditions.

The following relationship applies to, for instance, waves a1 and a2 running up to a two-port and the waves b1 and b2, which are respectively continuing in the opposite direction:

$$\begin{pmatrix} b_1 \\ b_2 \end{pmatrix} = \underbrace{\begin{pmatrix} S_{11} & S_{12} \\ S_{21} & S_{22} \end{pmatrix}}_{=(S)} \begin{pmatrix} a_1 \\ a_2 \end{pmatrix},$$

wherein [S] is the scattering matrix identifying the two-port.

One known calibration method for a two-port model with 10 or 12 error variables is the so-called 10-tern or 12-term method. It is also referred to as SOLT (S: Short, O: Open, L: Load=Match, T: Thru) in the American literature and as TMSO in Europe. It is the only system calibration method for two-port network analyzers with just three measurement locations, wherein each measurement location is located at the common measurement channel for both ports before the switch which switches each time one of the ports for measurement, and further measurement locations, which are arranged at the measurement channel of each port. But in this arrangement of the measurement locations, the switch is integrated in the measurement of the calibration standards.

In the case of this TMSO calibration method, which is used the most often in practice, it is necessary for the two measurement ports to be connected (T=Thru). Three known one-ports, e.g. wave sink (M=Match), short circuit (S=Short) and open circuit (O=Open), then have to be contact-connected and measured at each measurement port.

The multiport measurement problem stems from the fact that all the measurement ports are coupled to one another via the measurement object. This means that it is no longer the case that a measure of the incoming wave is obtained at one measurement location, a measure of the reflective wave is obtained at the next measurement location, and a measure of the transmitted wave is finally obtained at a further measurement location, independent of the terminations of the multiport. Rather, it is additionally necessary to take into account the reflection properties of the other measurement ports in the model.

PRIOR ART

In recent years, a number of solutions have been published and patented for this multiport measurement problem. The solution to the multiport measurement problem Ferrero, described in Ferrero, Pisani, Kerwin, "A New Implementation of a Multiport Automatic Network Analyzer", IEEE Trans. Microwave Theory Tech., vol. 40, Nov. 1992, pp. 2078–2085, requires a network analyzer with likewise 2n measurement locations with the same outlay on calibration standards as the TMSO method. Accordingly, the requirements made of the hardware of the calibration standards are very complex. Likewise, all the calibration standards have to be completely known in Ferrero's method. This is especially disadvantageous since the known standards have never been perfectly realized. Furthermore, Ferrero's method is based exclusively on the 7-term principle, resulting in significant measurement errors since the known standards have not been perfectly realized and the 7-term principle reacts substantially more sensitively to such model errors, as is described in Heuermann, "Sichere Verfahren zur Kalibrierung von Netzwerkanalysatoren für koaxiale und planare Leitungssysteme" [Reliable methods for the calibration of network analyzers for coaxial and planar line systems], Dissertation document, Institute for Radiofrequency Technology, Ruhr-University Bochum, 1995, ISBN 3-8265-1495-5.

The 10-term methods described in German Patent Application DE 199 18 697 A1 requires just n+1 measurement locations but only known calibration standards.

The multiport 7-term methods described in German Patent Application DE 199 18 960 A1, which build on an adaptation of the known two-port methods to a multiport method, comprise the methods TAN, TNA, LAN, TRL, TLR, LLR, LRL, TAR, TMR, TRM, TMS, LMS, TMO, LMO, UMSO, TMN, LNN, TZU, TZY, TYU, LZY, ZZU, YYU, QSOLT and generally require only n−1+2 calibration measurements.

A further method from the company ATM is described in U.S. Pat. No. 5,578,932. The patent specification describes in detail a so-called test set which can be used to extend a 2-port network analyzer to n ports. Furthermore, a special calibration device is described, which is required for the automatic calibration of the test set.

The calibration device contains, in addition to the standards open, short and match (also termination), an arrangement of different transmission lines which can be connected between the terminals of the calibration device via semiconductor switches. Consequently, as in the TMSO method, all the standards must be completely known. In contrast to the statement in the Abstract, however, complete multiport calibration and error correction does not take place. Instead, only two-port paths are calibrated; the remaining ports are not taken into account (column 18, line 57). Two-port measurements are carried out successively during later measurement operations. In this case, the measurement ports that are not included in the calibration are successively terminated by different reflection standards incorporated within the test set. Precisely one 2-port measurement is carried out for each value of the reflection standard (column 21, line 1). Once the measurements have been carried out at all measurement ports, a result corrected with respect to the systematic errors can be calculated from the measured values obtained and the known values of the reflection standards. According to the patent specification, the measurement of a 3-port test object requires 2 two-port measurements from port 1 to port 2 and from port 1 to port 3 (column 21, line 1 and line 45), in which case, for complete characterization of all the parameters, it is necessary to terminate the third port of the test object that was not included, during the measurement from port 1 to port 2, by at least 3 different reflection standards (column 21, line 28). This means that the complete characterization of a 3-port requires 3+1=4 two-port measurements, while the method presented here manages with 3 two-port measurements.

Moreover, the measurement of electronic devices on a wafer underlies certain boundary conditions especially with regard to the possibility of realization of calibration standards.

In the semiconductor field, it is not unusual for users to realize the calibration standards of the wafers themselves. The geometrical reproducibility and equality of calibration standards that are self-produced in this way is very high. What is also advantageous is that the calibration standards are situated on the same substrate carrier (semiconductor) as the measurement objects, too. In addition to the advantages of short travel distances, it is also possible to "calibrate out" parasitic elements and also transition effects from the measuring tip to the wafer. However, the electrical properties are realized only to a good approximation. The reflection standard open circuit, in particular, cannot be produced with the necessary quality.

Also the impedance standards (M) can be described very precisely on semiconductors, but generally vary greatly with regard to the DC resistances. In the described methods according to the prior art, it is necessary to connect M standards with an identical reflection behavior to each measurement port. If this cannot be ensured, as is the case in multiport on-wafer measurements since standards have to be arranged at an angle of 90° with respect to one another, then so-called strains occur, which are generally the source of very large measurement errors.

SUMMARY OF THE INVENTION

Therefore, it is an object of the invention to provide a method for calibrating a vectorial network analyzer having n measurement ports and at least 2n measurement locations used for multiport measurement which permits a calibration with increased precision and considerable reproducibility of measurement.

One embodiment of the invention will be referred to as the RRMT method. The RRMT method includes a calibration method as follows:

a) the first k calibration measurements are carried out at a two-port, which is realized by means of the direct connection of the measurement ports (through connection, T=Thru) or a short matched line (L=Line) of known length and attenuation, and which is connected between each of the k possible measurement port combination, b) a further calibration measurement is carried out at an n-fold one-port (n-one-port), which is realized by means of n known, if appropriate different, impedances (e.g. so-called wave terminations with 50 Ω, M=Match), c) a further calibration measurement is carried out at an n-one-port, which is realized by means of n unknown greatly reflective terminations (R=Reflect), which are similar to short circuits (S=Short), d) a further calibration measurement is carried out at an n-one-port, which is realized by means of n unknown greatly reflective terminations (R=Reflect) which are similar to open circuits (O=Open).

The RRMT method may also include a calculation of the reflection accounts as follows:

e) the reflection accounts of the n-one-ports, which is realized by means of n unknown greatly reflective terminations which are similar to open circuits or to short circuits, are mathematically determined.

The RRMT method is characterized by the measurement of two reflection standards, which are similar to short circuits and to open circuits, in addition to the measurements of n impedance standards at the n-fold one-port. With that, the RRMT method, and other embodiments of the invention, affords the advantages that the calibration standards do not have to be exactly known. Consequently, the multiport measurements can be carried out with high precision and low costs with these methods by using calibration standards which are produced from the customer. All the methods are characterized by the following criteria of the calibration standards:

1. The phase of the reflection standards R has to be known only to ±90°. More information is not required. In practice, a real short circuit and an open circuit are used. The divergences to an ideal short circuit or open circuit have no influence on the measurement accuracy.

2. The impedance standards M do have to be completely known. The latter may be different, however, in the case of the RRMT method. Such standards are often also referred to as transfer match.

3. The line standard T in the case of RRMT method and also the line standard L in the case of LRRM has to be completely known, but may have a finite attenuation and, if appropriate, a known reflection behavior. It is also possible to use different line standards between different measurement ports.

The use of the 10-term method for the calculation of the error coefficients of the measured two-port calibration standards and of the scattering matrix is particularly advantageous in combination with other features of RRMT method because the 10-term method is less sensitive to model errors.

Another advantage of the RRMT method is that the precision of the measurement is substantially increased due to the fact that the calibration measurements of n impedance standards are carried out at one n-one-port. Deviations of properties compared to the measured reference port are thus avoided at the so-called matching point (S 11=0) where the properties of the M standard are only "overcalculated." The additional measurements at the n-one-port compared to the measurements at the one-port are not disadvantageous since they proceed fully automatically to a considerable extent in the case of on-wafer measurements and their costs are a small portion of the costs of the system. Moreover, these measurements provide additional information for increasing the quality of the calibration method.

Also, the RRMT methods and the other methods are distinguished by the fact that they all use lines for the connections of the measurement ports. This is particularly true for on-wafer measurements in contrast to coaxial measurements, where the measurement ports (on-wafer measuring tips (probes)) cannot be directly connected. Therefore, it is never possible to use a genuine thru standard in on-wafer methods.

The normal and inevitable fluctuations in known DC impedances do not influence the methods of this invention.

When VNAs having 2n measurement locations are used, the methods of the invention operate significantly more precisely and with greater long-term stability compared to VNAs having n-1 measurement locations because drift effects of the electronic changeover switches have no influence on the measurement quality.

Another method involves:
a) the first n-1 calibration measurements are carried out at a two-port, which is realized by means of the direct connection of the measurement ports (through connection, T=Thru) or a short matched line (L=Line) of known length and attenuation, and which is connected between a reference measurement port and the remaining ports (n-1),
b) a further calibration measurement is carried out at an n-one-port, which is realized by means of n known, if appropriate different, impedances (e.g. so-called wave terminations 50 ohms, M=Match),
c) a further calibration measurement is carried out at n-one-port, which is realized by means of n unknown greatly reflective terminations (R=Reflect), which are similar to short circuits (S=Short),
d) a further calibration measurement is carried out at n-one-port, which is realized by means of an unknown greatly reflective termination (R=Reflect) which are similar to open circuit (O=Open); and
e) the reflection accounts of the n-one-ports, which is realized by means of n unknown greatly reflective terminations which are similar to open circuits or to short circuits, are mathematically determined.

This method makes it possible to use reflection standards which do not have to exactly known. Moreover, the calibration measurements according to this method are carried out with high precision since the impedance standards are measured at the n-one-port.

This second method is particularly useful for multiport measurements with n>2. That is because the method uses the 7-term method for calculation of error coefficients and a scattering matrix that reduces the calculational complexity and because the thru-standard is measured between a reference port and other n-1 ports instead of between all combinations of the ports. This method will be referred to as the multiport-RRMT method or GRRMT method. The increased sensitivity of the 7-term method with regard to the model errors does not have influence since the measurement of impedance is carried out at n-one-port so that an "overcalculating" is not necessary and because the 7-term method is an optimization of the calculational complexity for these multiports. The described advantages in circuit and in measurement of the RRMT method also characterize the multiport-RRMT method.

Alternative to the RRMT and GRRMT methods, it is possible that for the multiport measurements with n>2, the calibration measurement is carried out at a one-port instead at a n-one-port and the properties of the impedance at the other n-1 one-ports are calculated from this calibration measurement. These embodiments of the invention shall be called the LRRM method and the GLRRM, or multiport-LRRM method. In both methods, the calculational complexity and the complexity in circuit and in measurement are optimized with regard to the required precision of measurement.

The four methods in this invention differ in implementation only by nuances, but these nuances can have a significant effect in practice. The greatest difference is between the RRMT and GRRMT methods and the multiport LRRM methods. In the multiport LRRM methods, only one match standard is contact-connected at a reference port and measured. Whereas, both RRMT methods use an impedance standard which is contact-connected and measured at each port and which does not have to equate with any other impedance standard.

The difference between the two RRMT and multiport LRRM methods resides in the number of T and L measurements, respectively. The methods may also require k measurements, in addition to n-1 measurements. The methods requiring k measurements are in turn distinguished by a greater robustness. Thus, it can be shown, e.g., that the transmission measurement dynamic range in the case of methods requiring k measurements corresponds to that of the apparatus. These methods are used when measurement of the dynamic range of the network analyzer has to be achieved. On the other hand, the methods requiring n-1 measurements exhibit a significantly greater sensitivity with regard to small contact-connection errors and incompletenesses in the calibration standards. Consequently, the methods requiring n-1 measurements will be used only if the number n of measurement ports is disproportionately large.

With such low demands made of the calibration standards, the multiport calibration method according to the invention can also be used for automated calibrations of VNAs in coaxial environments. Algorithms and associated switching networks are already marketed by a number of manufacturers for two-port calibrations. In multiport calibrations, the number of contact-connections of the calibration standards is appreciably larger, which costs time and money and entails greater risks of errors.

BRIEF DESCRIPTION OF THE DRAWINGS

The invention will be explained in more detail below using an exemplary embodiment. The issued drawings show:

FIG. 1 shows two-port characterized by its scattering matrix. The waves $a_1$ and $a_2$ are the waves travelling to the two-port and $b_1$ and $b_2$ correspondingly the waves propagating in the opposite direction. The following relationship holds true:

$$\begin{pmatrix} b_1 \\ b_2 \end{pmatrix} = \underbrace{\begin{pmatrix} S_{11} & S_{12} \\ S_{21} & S_{22} \end{pmatrix}}_{=(S)} \begin{pmatrix} a_1 \\ a_2 \end{pmatrix}.$$

Figure 1:
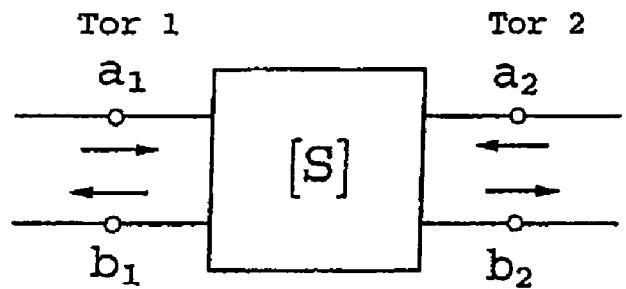
FIG. 1 a schematic definition of a scattering matrix and waves entering and leaving at the two-port and FIG. 2 a block diagramm of a vectorial three-port network analyzer.
Figure 2:
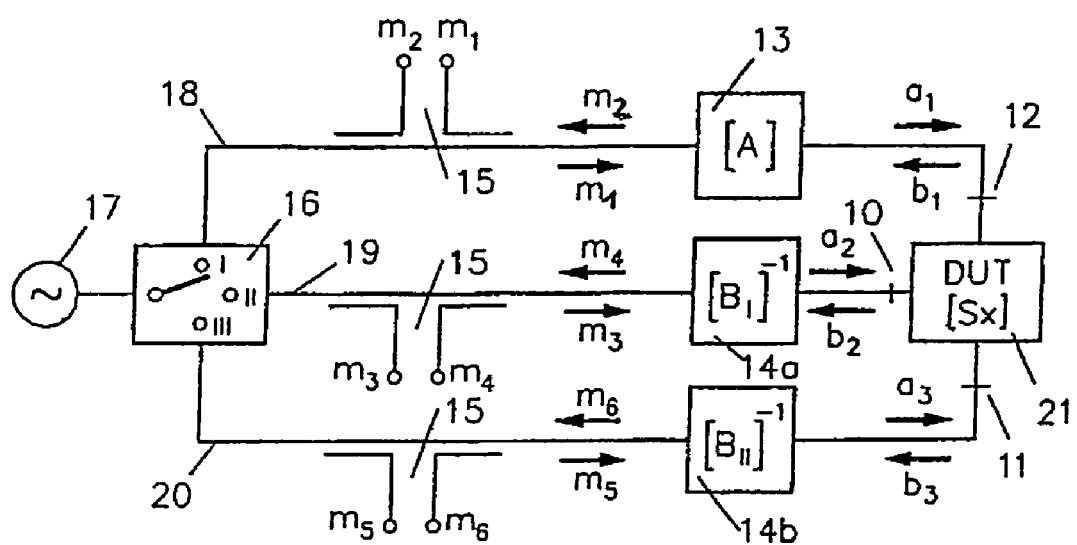

The interesting special case of a 3-port network analysis system is illustrated as a block diagram in FIG. 2. It can be seen that 2n=6 measurement locations (15) are necessary. FIG. 2 demonstrates how such a construction is to be realized and serves as a basis for the description of the multiport methods.

DETAILED DESCRIPTION OF THE PREFERRED EMBODIMENTS

FIG. 2 illustrates how the signal from source 17 is conducted via a changeover switch 16, whose properties, e.g., reproducibility, reflection and long-term stability, therefore do not influence the measurement accuracy, onto the three branches 18, 19 and 20. The measurement location 15, assumed to be ideal, in each case makes a measurement of the incoming and transmitted waves. All deterministic nonidealities and incompletenesses in the form of mismatches and crosstalk are combined and taken into account in the error matrices 13, 14a and 14b. At the ports 10, 11 and 12, measurement object 21 (DUT) is connected to the vectorial network analyzer.

The measurement values $m_n$ for the reflection and transmission behavior of realized calibration standards are measured in each switch position at two measurement locations each time. For the RRMT method, there are the thru standards of known length and attenuation which are connected between each possible measurement port combination, the match standards, and the reflection standards which are similar to short and open circuits, all being measured at n-one-port. As far as one of the other methods of the invention is carried out, these measurement values $m_n$ are measured with the features as disclosed in the corresponding claim. The scattering matrix is calculated from these measurement values $m_n$ as is described in the following.

The methods can be subdivided into three steps from a mathematical standpoint:

1. so-called self-calibration of the unknown reflection standards;

2. so-called direct calibration; and 3. system error correction.

In the first step, the unknown parameters of the calibration standards are calculated. Trace and determinant properties of mapping matrices are utilized here, as described in Heuermann, "Sichere Verfahren zur Kalibrierung von Netzwerkanalysatoren für koaxiale und planare Leitungssysteme", [Reliable methods for the calibration of network analyzers for coaxial and planar line systems], Dissertation document, Institute for Radiofrequency Technology, Ruhr-University Bochurm, 1995, ISBN 3-8265-1495-5. The match calibration standards are not taken into account with ideal properties (S 11=0) in mathematics. This has the effect that the resultant equations for calculating the reflection values of the two R standards are significantly longer. However, these equations do not differ from the customary solutions of self-calibration calculations with regard to the above called unambiguity considerations for the line, impedance and reflection standards.

In the case of the second step of direct calibration, the error coefficients are calculated. This is done for the RRMT method and for the LRRM method using traditional routes of the 10-term methods, as have been described in Schick, "Messsysteme der Hochfrequenztechnik", [Measurement systems of radio frequency technology] Hüthig-Verlag, Heidelberg, 1984 and Heuermann, "Sichere Verfahren zur Kalibrierung von Netzwerkanalysatoren für koaxiale und planare Leitungssysteme", [Reliable methods for the calibration of network analyzers for coaxial and planar line systems], Dissertation document, Institute for Radiofrequency Technology, Ruhr-University Bochum, 1995, ISBN 3-8265-1495-5. A two-port calibration is carried out for each through connection and the error coefficients are known for this connection. The route for the treatment of the multiport method is then described as the third step.

For the methods requiring n−1 measurements, routes of the 7-term methods for the calculation of the error coefficients are already described in Heuermann, "Sichere Verfahren zur Kalibrierung von Netzwerkanalysatoren für koaxiale und planare Leitungssysteme", [Reliable methods for the calibration of network analyzers for coaxial and planar line systems], Dissertation document, Institute for Radiofrequency Technology, Ruhr-University Bochum, 1995, ISBN 3-8265-1495-5 for similar two-port methods. The combination of these results of the two-port methods into a multiport method is likewise explained in the next step.

In the case of the third step for carrying out a system error correction, the measurement data of an unknown measurement object are corrected by the errors of the VNA and the leads.

For the methods which are based on the 10-term principle, the error model in FIG. 2 forms the initial basis for the mathematical description of the 10-term multiport methods. For the sake of simplicity, here shall be carried out the mathematical derivation for the measurement of three-ports. This procedure can be generalized to n-ports in a simple manner by providing a changeover switch with n output ports and taking into account two additional measurement locations for each further port of the measurement object.

In order to determine the traditional error matrices of the 10-term model, a two-port calibration is carried out between each measurement port combination with the error matrices [A], [F], and [G]. The following holds true: $[F]=[B_1]^{-1}$ and $[G]=[B_{11}]^{-1}$.

For the switch position I, the error matrix [A] is the reference port, containing three error variables, for II it is [F] and for III [G]. The two other measurement ports for each switch position contain only the two error variables (e.g.: $F_T$, $F_L$) of the transmission error network. The associated variables are subsequently deleted once, twice and three times, depending on the switch position. Consequently, 3*3+3*2*2=21 error variables result for the three-port case. The correction calculation of the measured values of the measurement object ($m_i$) using the 21 error variables can be formulated as follows:

$$\begin{pmatrix} m'_2 \\ a'_1 \end{pmatrix} = [A']^* \begin{pmatrix} m'_1 \\ b'_1 \end{pmatrix}, \quad b'_2 = m'_1/F'_T, \tag{2}$$

$$a'_2 = F'_L * b'_2, \quad b'_3 = m'_6/G'_T, \quad a'_3 = G'_r * b'_3. \tag{3}$$

Rearrangement yields 6 equations for the 6 wave variables $a'_1$, $a'_2$, $a'_3$, $b'_1$, $b'_2$, $b'_3$.

The procedure is exactly the same for the remaining switch positions. These 3*6 equations can be used in the equation.

$$\begin{pmatrix} b_1 \\ b_2 \\ b_3 \end{pmatrix} = [Sx] \begin{pmatrix} a_1 \\ a_2 \\ a_3 \end{pmatrix} \quad (4)$$

In this case, the values of a matrix column are obtained for each switch position, which ultimately leads to a system of linear equations comprising two n*n measured value matrices and the n*n scattering matrix. If this system of equations is resolved with respect to the [Sx] matrix, then the error-corrected scattering parameters of an n-port are available.

For the methods which are based on the 7-term principle, the error model in FIG. 2 also forms the initial basis for the mathematical description of the 7-term multiport methods. For the sake of simplicity, here also shall be carried out the mathematical derivation for the measurement of three-ports. This procedure can be generalized to n-ports in a simple manner by providing a changeover switch with n output ports and taking account of two additional measurement locations for each further port of the measurement object.

In order to determine the traditional error matrices of the 7-term model, a two-port calibration is carried out between the reference port with the error matrix [A] and the error matrices $[B_i]$ (i=1, 2, ..., n). The designation 7-term module stems from the fact that the associate 2*2 error matrices [A] and $[B_i]$ contain a total of 7 error terms since one of the 8 variables contained can always be set to 1.

It is subsequently advantageous to formulate the mathematical formulation of the two-port model in the inverse form of the transmission parameters specified:

$$[G]=[A]^{-1}, [H_i]=[B_i], i=1, 2 \quad (2)$$

where the following holds true for the inputs and outputs at the error networks:

$$\begin{pmatrix} b_1 \\ a_1 \end{pmatrix} = [G]^* \begin{pmatrix} m_1 \\ m_2 \end{pmatrix} \cdot \begin{pmatrix} a_1 \\ b_1 \end{pmatrix} = [H_1]^* \begin{pmatrix} m_{u-1} \\ m_u \end{pmatrix} \quad (3)$$

These equations can be resolved with respect to the $a_i$ and $b_i$ $$\begin{pmatrix} b_1 \\ b_2 \\ b_3 \end{pmatrix} = [Sx] \begin{pmatrix} a_1 \\ a_2 \\ a_3 \end{pmatrix} \quad (4)$$

wave variables and be used in the equation. In this case, the values of a matrix column are obtained for each switch position, which ultimately leads to a system of linear equations comprising two n*n measured value matrices and the n*n scattering matrix. If this system of equations is resolved with respect to the [Sx] matrix, then the error-corrected scattering parameters of an n-port are available.

LIST OF REFERENCE SYMBOLS

10 Port
11 Port
12 Port
13 Error matrix
14a Error matrix
14b Error matrix
15 Measurement location
16 Changeover switch
17 Source
18 Branch
19 Branch
20 Branch
21 Measurement object

The invention claimed is:

1. A method for calibrating a vectorial network analyser having n measurement ports and at least 2n measurement locations (n>1), the method comprising:
    successive measurement of the reflection and transmission parameters at k=sum (n−1) for (i=1, 2, ..., n−1) or n−1 different two-port calibration standards, which are connected between the measurement ports in any desired order and all have a transmission path, and three different n-port calibration standards, which are connected between the measurement ports in any desired order and are permitted to have no transmission;
mathematical determination of error coefficients of the network analyser with the 10-term method in the k-fold application and measured two-port calibration standards; and by mathematical determination of the scattering matrix $[S_x]$, in which the errors are corrected, with the 10-term method, wherein the method further comprises:
    a) carrying out the first k calibration measurements at a two-port, which is realized by means of the direct connection of the measurement ports (through connection, T=Thru) or a short matched line (L=Line) of known length and attenuation, and which is connected between each of the k possible measurement port combinations,
    b) carrying out a further calibration measurement at an n-fold one-port (n-one-port), which is realized by means of n-known wave terminations (M=Match), wherein the n-known wave terminations have unrestricted values so that they can be different from each other,
    c) carrying out a further calibration measurement at an n-one-port, which is realized by means of n-unknown greatly reflective terminations (R=Reflect), which are similar to short circuits (S=Short),
    d) carrying out a further calibration measurement at an n-one-port, which is realized by means of n-unknown greatly reflective terminations (R=Reflect) which are similar to open circuits (O=Open) and
    e) mathematically determining the reflection accounts of the n-one-ports that are realized by means of n-unknown greatly reflective terminations which are similar to open circuits or to short circuits.

2. The method for calibrating a vectorial network analyser according to claim 1, wherein
    a) n>2 holds true,
    b) the further calibration measurement is carried out at a one-port, which is realized by means of a known wave termination (M=Match), instead of at a n-one-port, which is realized by means of n-known wave terminations.

3. The method for calibrating a vectorial network analyser claim 1 wherein one of the greatly reflective terminations is known.

4. A method for calibrating a vectorial network analyser having n measurement ports and at least 2n measurement locations (n>1), the method comprising:

successive measurement of the reflection and transmission parameters at n−1 different two-port calibration standards, which are connected between the measurement ports in any desired order and all have a transmission path, and three different n-port calibration standards, which are connected between the measurement ports in any desired order and are permitted to have no transmission;

mathematical determination of error coefficients of the network analyser with the 7-term method in the n-1-fold application and measured two-port calibration standards; and mathematical determination of the scattering matrix $[S_x]$, in which the errors are corrected, with the 7-term method, wherein the method further comprises:
a) carrying out the first n−1 calibration measurements at a two-port, which is realized by means of the direct connection of the measurement ports (through connection, T=Thru) or a short matched line (L=Line) of known length and attenuation, and which is connected between a reference measurement port and the remaining ports (n−1),
b) carrying out a further calibration measurement is carried out at an n-one-port, which is realized by means of n-known wave terminations (M=Match), wherein the n-known wave terminations have unrestricted values so that they can be different from each other,
c) carrying out a further calibration measurement at an n-one-port, which is realized by means of n-unknown greatly reflective terminations (R=Reflect), which are similar to short circuits (S=Short),
d) carrying out a further calibration measurement at an n-one-port, which is realized by means of n-unknown greatly reflective terminations (R=Reflect) which are similar to open circuits (O=Open) and
e) mathematically determining the reflection accounts of the n-one-ports that are realized by means of n-unknown greatly reflective terminations which are similar to open circuits or to short circuits.

5. The method for calibrating a vectorial network analyser according to claim 4 wherein
a) n>2 holds true,
b) the further calibration measurement is carried out at a one-port, which is realized by means of a known wave termination (M=Match), instead of at a n-one-port, which is realized by means of n-known wave terminations.

6. The method for calibrating a vectorial network analyser according to claim 4 wherein one of the greatly reflective terminations is known.

7. The method for calibrating a vectorial network analyser according to claim 1 or 4, wherein the further calibration measurement is carried out at a (n-i)-one-port, wherein i<n, which is realized by a known wave termination (M=Match), instead of at a n-one-port, which is realized by means of n-known wave terminations.

* * * * *